US012615757B2

(12) United States Patent
Fishburn

(10) Patent No.: US 12,615,757 B2
(45) Date of Patent: Apr. 28, 2026

(54) SEMICONDUCTOR ISOLATION BRIDGE FOR THREE-DIMENSIONAL DYNAMIC RANDOM-ACCESS MEMORY

(71) Applicant: Applied Materials, Inc., Santa Clara, CA (US)

(72) Inventor: Fredrick Fishburn, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 524 days.

(21) Appl. No.: 17/887,768

(22) Filed: Aug. 15, 2022

(65) Prior Publication Data

US 2023/0055158 A1 Feb. 23, 2023

Related U.S. Application Data

(60) Provisional application No. 63/235,945, filed on Aug. 23, 2021.

(51) Int. Cl.
*H01L 27/108* (2006.01)
*H10B 12/00* (2023.01)

(52) U.S. Cl.
CPC ................................... *H10B 12/05* (2023.02)

(58) Field of Classification Search
CPC ...................................................... H10B 12/05
See application file for complete search history.

(56) References Cited

U.S. PATENT DOCUMENTS

| | | | |
|---|---|---|---|
| 6,661,042 B2 | 12/2003 | Hsu | |
| 2016/0141299 A1* | 5/2016 | Hong | H10B 41/35 |
| | | | 438/157 |
| 2018/0323199 A1 | 11/2018 | Roberts et al. | |
| 2018/0374862 A1* | 12/2018 | Lee | H10B 43/40 |
| 2020/0176465 A1 | 6/2020 | Tang et al. | |
| 2020/0212041 A1 | 7/2020 | Machkaoutsan et al. | |
| 2020/0411522 A1 | 12/2020 | Tang et al. | |
| 2021/0159227 A1 | 5/2021 | Widjaja et al. | |
| 2022/0149046 A1* | 5/2022 | Karda | G11C 11/4085 |
| 2023/0397402 A1* | 12/2023 | Lee | H10B 12/30 |
| 2024/0260254 A1* | 8/2024 | Karda | H10B 12/03 |

FOREIGN PATENT DOCUMENTS

| | | | | | |
|---|---|---|---|---|---|
| JP | 2016100596 A | * | 5/2016 | .......... | H10D 64/681 |
| KR | 20250058556 A | * | 4/2025 | .......... | H10D 30/025 |
| WO | WO-2025029337 A1 | * | 2/2025 | ....... | H01L 21/02252 |

OTHER PUBLICATIONS

PCT International Search Report and Written Opinion in PCT/US2022/040982 dated Dec. 13, 2022, 8 pages.
(Continued)

*Primary Examiner* — Peter Bradford
(74) *Attorney, Agent, or Firm* — Servilla Whitney LLC

(57) ABSTRACT

Semiconductor devices and methods of manufacturing the same are described. The methods form a 3D DRAM architecture that includes a semiconductor isolation bridge, eliminating a floating body effect. The method includes forming an epitaxial layer in a deep trench isolation opening and creating a semiconductor isolation bridge between adjacent deep trench isolation openings.

20 Claims, 13 Drawing Sheets

100A

(56)     References Cited

OTHER PUBLICATIONS

Cho, Youngseung, et al., "Suppression of the Floating-Body Effect of Vertical-Cell DRAM With the Buried Body Engineering Method", in IEEE Transactions on Electron Devices, vol. 65, No. 8, pp. 3237-3242, Aug. 2018, doi: 10.1109/TED.2018.2849106.
Giusi, Gino, "Floating Body DRAM with Body Raised and Source/ Drain Separation", Electronics 2021, 10, 706. https://doi.org/10. 3390/electronics10060706.
Liu, Xuelian, et al., "A Three-Dimensional DRAM Using Floating Body Capacitance Cells in an FD-SOI Process", Radioengineering, vol. 22, No. 4, Dec. 2013.
Vandana, B., "Study of Floating Body Effect in SOI Technology", International Journal of Modern Engineering Research (IJMER), vol. 3, Issue. 3, May-Jun. 2013 pp. 1817-1824.

* cited by examiner

10

100A

100B

100A

100A

100B 120  126     132  134

108

132

SEMICONDUCTOR ISOLATION BRIDGE FOR THREE-DIMENSIONAL DYNAMIC RANDOM-ACCESS MEMORY

CROSS-REFERENCE TO RELATED APPLICATIONS

This application claims priority to U.S. Provisional Application No. 63/235,945, filed Aug. 23, 2021, the entire disclosure of which is hereby incorporated by reference herein.

TECHNICAL FIELD

Embodiments of the disclosure generally relate to semiconductor devices. More particularly, embodiments of the disclosure provide three-dimensional dynamic random-access memory cells and methods for forming three-dimensional dynamic random-access memory cells.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices. The formation of a low resistance contact between the active area and the 3D DRAM bottom electrode is essential for performance of the device.

In DRAM devices, one of the main goals is to increase storage per unit space, which results in an increase of the vertical dimensions or the stack height of the DRAM devices. The vertical-cell DRAM has the advantage of reducing the chip area by about one third compared with the conventional cell DRAM. Since the bit line is made in silicon trenches, however, a floating-body access transistor may be formed.

Accordingly, there is a need for 3D DRAM devices and methods of manufacture that do not result in a floating body access transistor and that do not increase the area of the cell.

SUMMARY

One or more embodiments of the disclosure are directed to methods of forming a semiconductor memory device. In one or more embodiments, a method of forming a semiconductor memory device comprises: forming a memory stack comprising alternating layers of a first material layer and a second material layer; etching a plurality of openings in the memory stack to form at least one deep trench isolation opening, at least one word line opening, and at least one P-substrate opening; depositing a first oxide layer in each of the at least one deep trench isolation opening, at least one word line opening, and at least one P-substrate opening; selectively removing the first oxide layer from the at least one P-substrate opening; forming an epitaxial layer in the at least one P-substrate opening; enlarging the at least one deep trench isolation opening; depositing a second oxide layer in the at least one deep trench isolation opening; depositing a nitride layer in the at least one deep trench isolation opening and on the second oxide layer; removing the first oxide layer from the word line opening; and forming a word line gate in the at least one word line opening.

Additional embodiments of the disclosure are directed to methods of forming a semiconductor memory device. In one or more embodiments, a method of forming a semiconductor memory device comprises: depositing a first oxide layer in each of a at least one deep trench isolation opening, at least one word line opening, and at least one P-substrate opening in a memory stack, the memory stack comprising alternating layers of a first material layer and a second material layer; selectively removing the first oxide layer from the at least one P-substrate opening; forming an epitaxial layer in the P-substrate opening; forming a bridge between adjacent deep trench isolation openings; depositing a second oxide layer in the at least one deep trench isolation opening; depositing a nitride layer in the at least one deep trench isolation opening and on the second oxide layer; depositing a high-K layer in the P-substrate opening on a top surface of the epitaxial layer; removing the first oxide layer from the word line opening; and forming a word line gate in the at least one word line opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
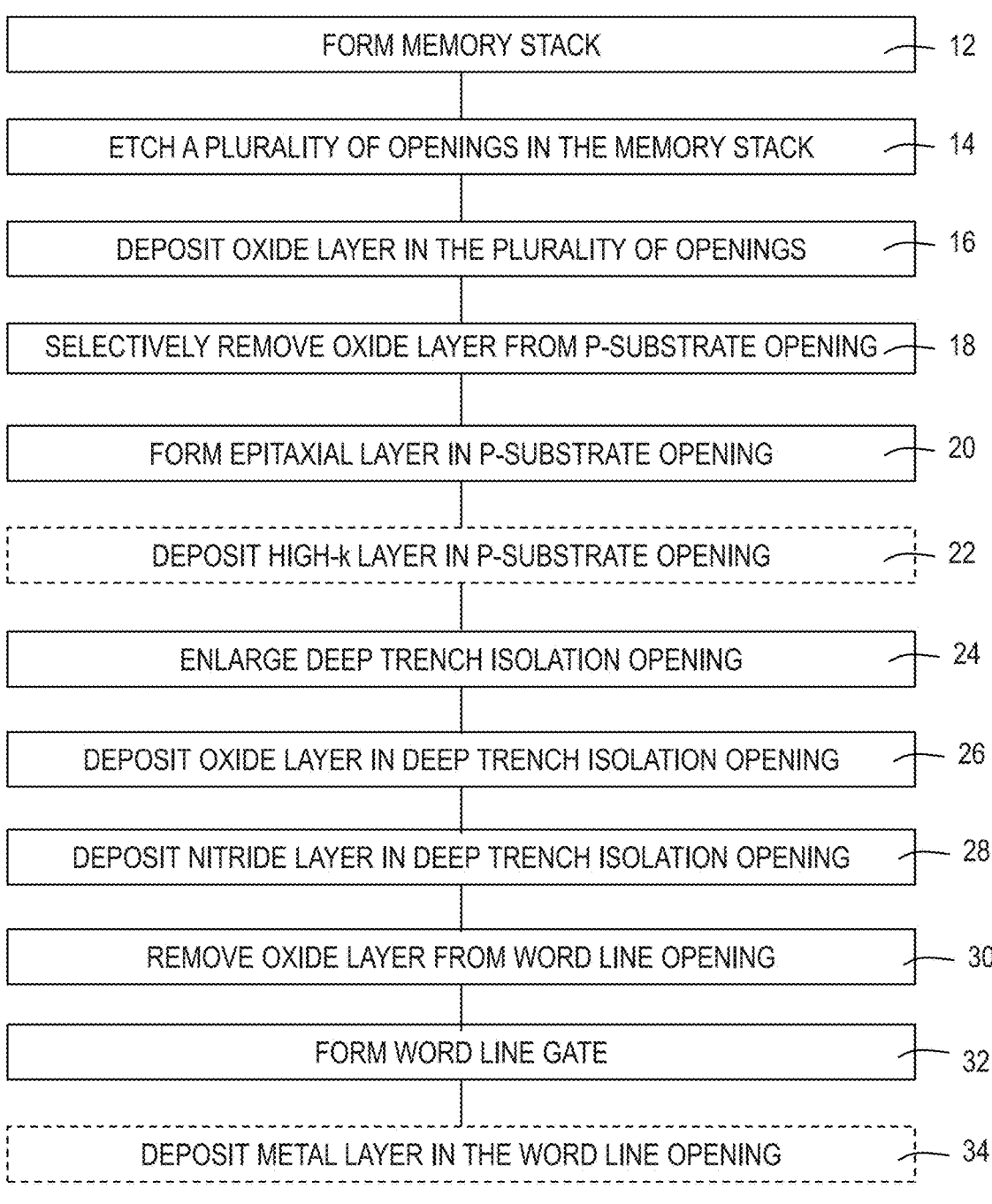
FIG. 1 illustrates a process flow diagram of a method according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

As used in this specification and the appended claims, the terms "precursor", "reactant", "reactive gas" and the like are used interchangeably to refer to any gaseous species that can react with the substrate surface.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated VDs. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nano-structure, with a diameter on the order of a nanometer (10-9 meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells.

Traditionally, DRAM cells have recessed high work-function metal structures in buried word line structure. In a DRAM device, a bit line is formed in a metal level situated above the substrate, while the word line is formed at the polysilicon gate level at the surface of the substrate. In the buried word line (bWL), a word line is buried below the surface of a semiconductor substrate using a metal as a gate electrode.

As used herein, the term "floating body effect" refers to major parasitic effect in silicon-on-insulator technology and is a consequence of the complete isolation of the transistor from the substrate. The effect is related to the build-up of a positive charge in the silicon body of the transistor, originating in holes created by band to band tunneling. This charge cannot be removed rapidly enough, primarily because no contact with the silicon film is available. The floating body effect can lead to circuit instabilities, frequency-dependent delay time, and pulse stretching.

The embodiments of the disclosure are described by way of the Figures, which illustrate devices (e.g., transistors, memory devices, and the like) and processes for forming the devices in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, semiconductor memory devices are fabricated. In one or more embodiments, a local vertical substrate connection to all the channels is advantageously formed. A portion of the deep trench isolation (DTI) is used epitaxial silicon is grown on the memory stack sidewall of the DTI and bottom of the DTI where it connects with the original silicon wafer substrate.

In one or more embodiments, the epitaxial silicon can be grown with boron doping to make the P-substrate or can be doped after epitaxial growth to make a graded doping profile. The center of the P-substrate pillar can have a high-K oxide layer, e.g., aluminum oxide ($Al_2O_3$) to make the back surface more P-type (dipole). In one or more embodiments, there may be a gate deposited in the center of the P-substrate pillar for a true backgate (P-type).

In one or more embodiments, because this epitaxial layer is not doped with germanium, it will not be recessed when the gap for the gate oxide and gate electrode are formed and will remain as a substrate connection for the channels. Isolation between channels at this location where they are connected by silicon will then be accomplished by boron doping, much in the same way that the bottom of the 2D DRAM bWL fins are laterally isolated from each other.

FIG. 1 illustrates a process flow diagram for a method 10 for forming a semiconductor device in accordance with some embodiments of the present disclosure. FIGS. 2A-6B depict the stages of fabrication of semiconductor structures in accordance with some embodiments of the present disclosure. The method 10 is described below with respect to FIGS. 2A-6B. FIGS. 2A-6B are top views and cross-sectional views of an electronic device according to one or more embodiments. The method 10 may be part of a multi-step fabrication process of a semiconductor device. The methods and structures of one or more embodiments use a gate all-around (GAA) transistor that incorporates crystalline silicon (c-Si) and crystalline silicon germanium (c-SiGe) in alternating heteroepitaxy grown layers to form a structure for 3D DRAM.

In one or more embodiments, the method 10 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Figure 2A:
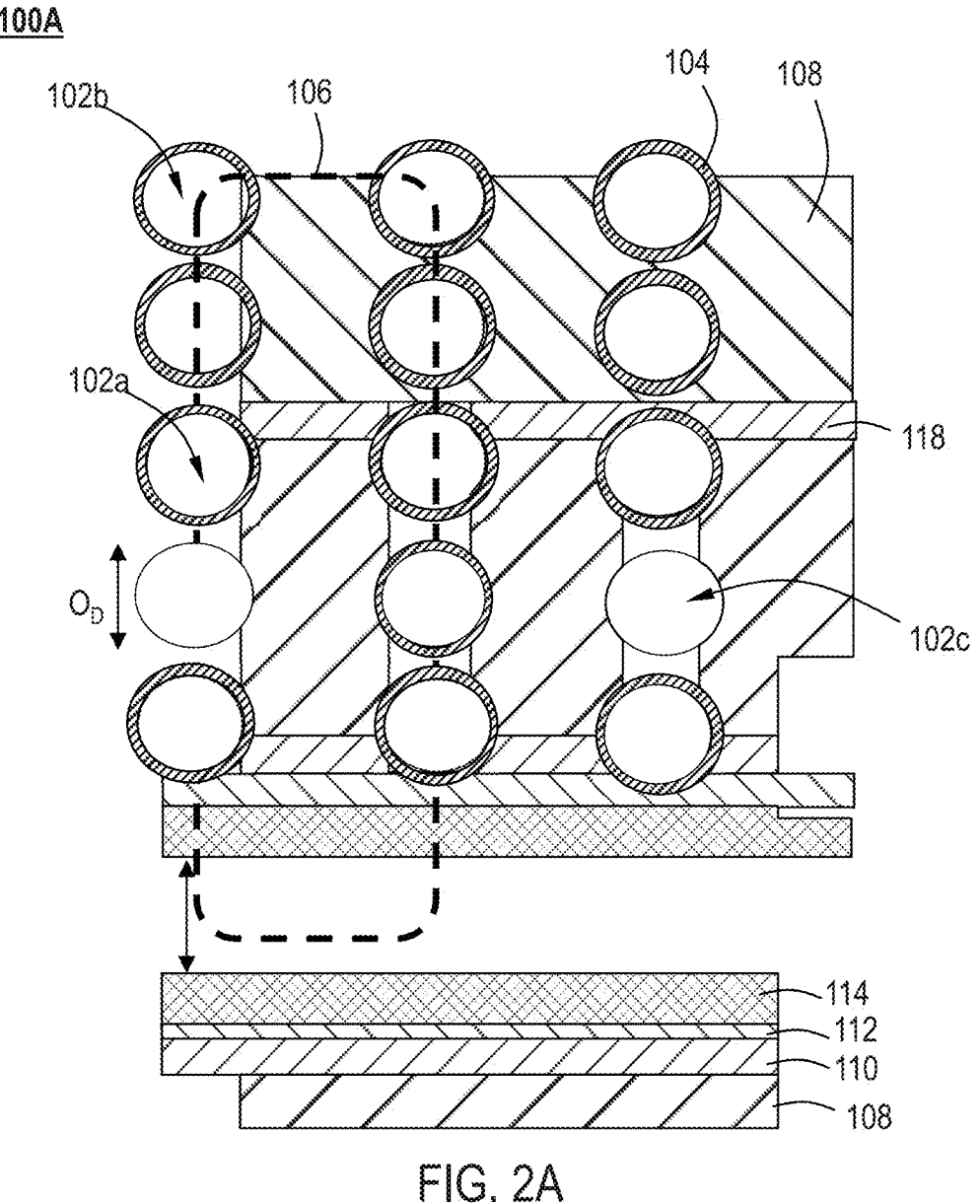
FIG. 2A illustrates a top view of a device according to one or more embodiments.
Figure 2B:
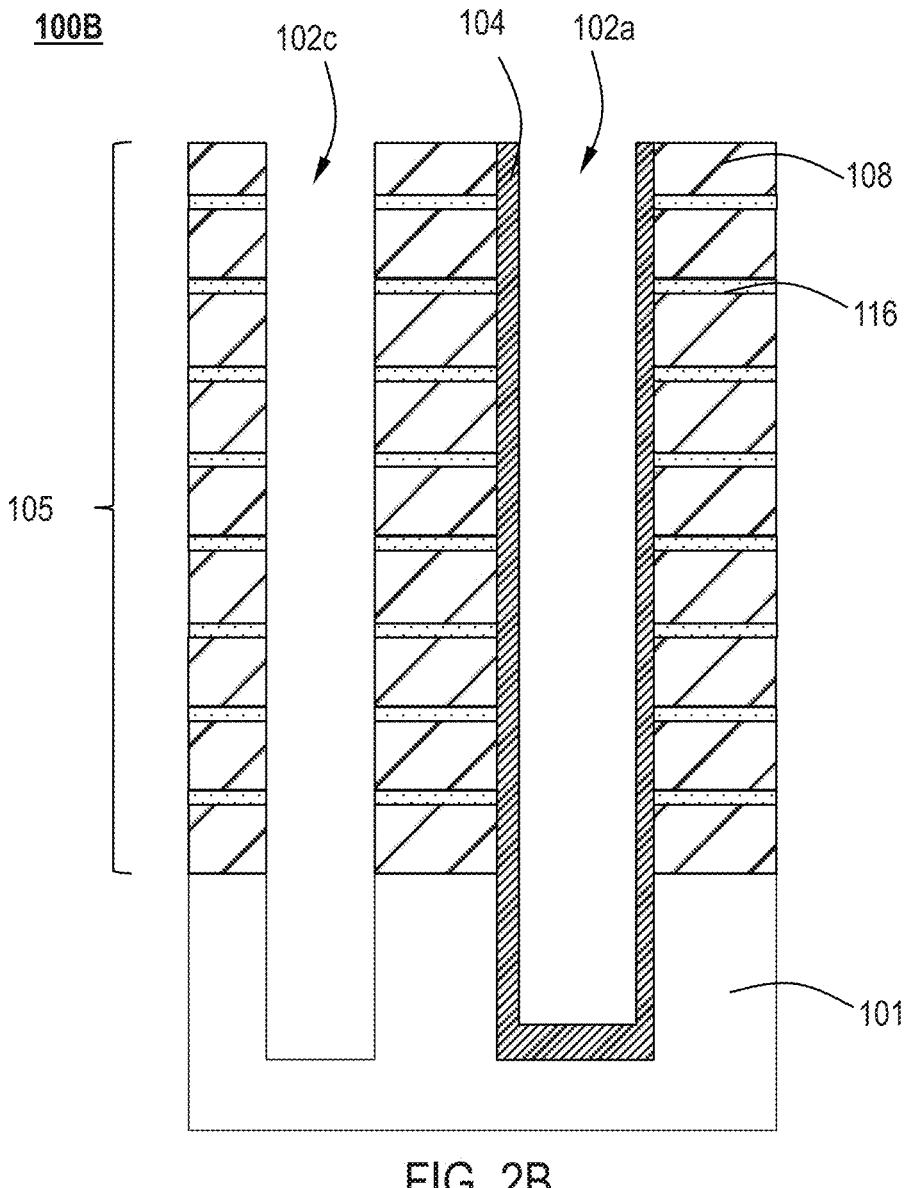
FIG. 2B illustrates an enlarged cross-section view of a portion of the device of FIG. 2A according to one or more embodiments.

FIG. 2A is a top view 100A of an electronic device according to one or more embodiments. FIG. 2B is an enlarged cross section view 100B take along region 106 of the device illustrated in FIG. 2A. Referring to FIG. 1 and FIG. 2B, the method 10 of forming the device 100 begins at operation 12, by forming a memory stack 105 on a substrate 101.

In some embodiments, the substrate 101 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 101 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 101 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate 101 may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

With reference to FIGS. 2A and 2B, the memory stack 105 in the illustrated embodiment comprises a plurality of alternating first material layers 108 and second material layers 116. While the memory stack 105 illustrated in FIG. 2B has eight sets of alternating first material layers 108 and second material layers 116, one of skill in the art recognizes that this is merely for illustrative purposes only. The memory stack 105 may have any number of alternating first material layers 108 and second material layers 116. For example, in some embodiments, the memory stack 105 comprises 192 pairs of alternating first material layers 108 and second material layers 116. In other embodiments, the memory stack 105 comprises greater than 50 pairs of alternating first material layers 108 and second material layers 116, or greater than 100 pairs of alternating first material layers 108 and second material layers 116, or greater than 300 pairs of alternating first material layers 108 and second material layers 116.

In one or more embodiments, sequential depositions are used to form many active area regions. In one or more embodiments, alternating layers of films, e.g., oxide-polysilicon, polysilicon-nitride, oxide-nitride, silicon-silicon germanium, are deposited.

In one or more embodiments, the first material layers 108 and the second material layers 116 independently comprise an insulating material. The second layers 116 may comprise a material that is etch selective relative to the first layers 108 so that the second layers 116 can be removed without substantially affecting the first layers 108. In one or more embodiments, the first layers 108 comprise silicon (Si). In one or more embodiments, the second layers 116 comprise silicon germanium (SiGe). In one or more embodiments first layers 108 and second layers 116 are deposited by chemical vapor deposition (CVD) or physical vapor deposition (PVD).

The individual alternating layers may be formed to any suitable thickness. In some embodiments, the thickness of each second layer 116 is approximately equal. In one or more embodiments, each second layer 116 has a second layer thickness. In some embodiments, the thickness of each first layer 108 is approximately equal. As used in this regard, thicknesses which are approximately equal are within +/−5% of each other. In one or more embodiments, the first layers 108 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first layer 108 has a thickness in the range of from about 0.5 to about 40 nm. In one or more embodiments, the second layers 116 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second layer 116 has a thickness in the range of from about 0.5 to about 40 nm.

With reference to FIG. 1 and FIGS. 2A-2B, at operation 14, a plurality of openings 102a, 102b, 102c are formed in the memory stack 105, extending from a top surface of the memory stack 105 to the substrate 101. In some embodiments, the plurality of openings 102a, 102b, 102c extend into the substrate 101.

As used in this regard, the term "opening" means any intentional surface irregularity. Suitable examples of openings include, but are not limited to, trenches which have a top, two sidewalls and a bottom. Openings can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

In one or more embodiments, the plurality of openings 102a, 102b, 102c may be formed by any suitable means known to the skilled artisan. In some embodiments, the plurality of openings 102a, 102b, 102c are formed by etching. In some embodiments, the plurality of openings 102a, 102b, 102c can include one or more of at least one deep trench isolation opening 102b, at least one word line opening 102a, and at least one P-substrate opening 102c.

The plurality of openings 102a, 102b, 102c may have any suitable diameter know to the skilled artisan. In some embodiments, the plurality of openings have a diameter, OD, in a range of from 50 nm to 75 nm.

FIG. 2B is an enlarged cross section view 100B take along region 106, illustrating two adjacent openings 102a and 102c.

With reference to FIG. 1 and FIGS. 2A-2B, in one or more embodiments, at operation 16, an oxide layer 104 is deposited in each of the at least one deep trench isolation opening 102b, at least one word line opening 102c, and at least one P-substrate opening 102a. The oxide layer 104 may comprise any suitable oxide material known to the skilled artisan. In some embodiments, the oxide layer 104 includes one or more of silicon oxide (SiO$_2$), aluminum oxide (Al$_2$O$_3$), carbon, and nitride. Accordingly, in some embodiments, the oxide layer is an oxycarbide layer. In other embodiments, the oxide layer may be an oxycarbonitride layer. In one or more embodiments, the oxide layer 104 has a thickness that is thick enough to block the underlying silicon surface from selective epitaxial growth after any chemical or hydrogen reduction prior to selective epi, but still thin enough that it does not fill the hole and therefore can be isotropically removed. In one or more embodiments, the oxide layer 104 has a thickness in a range of from 3 nm to 30 nm thick.

At operation 18, the oxide layer is selectively removed from the P-substrate openings 102c. The oxide layer 104 may be selectively removed by any suitable process known to the skilled artisan.

Figure 3A:
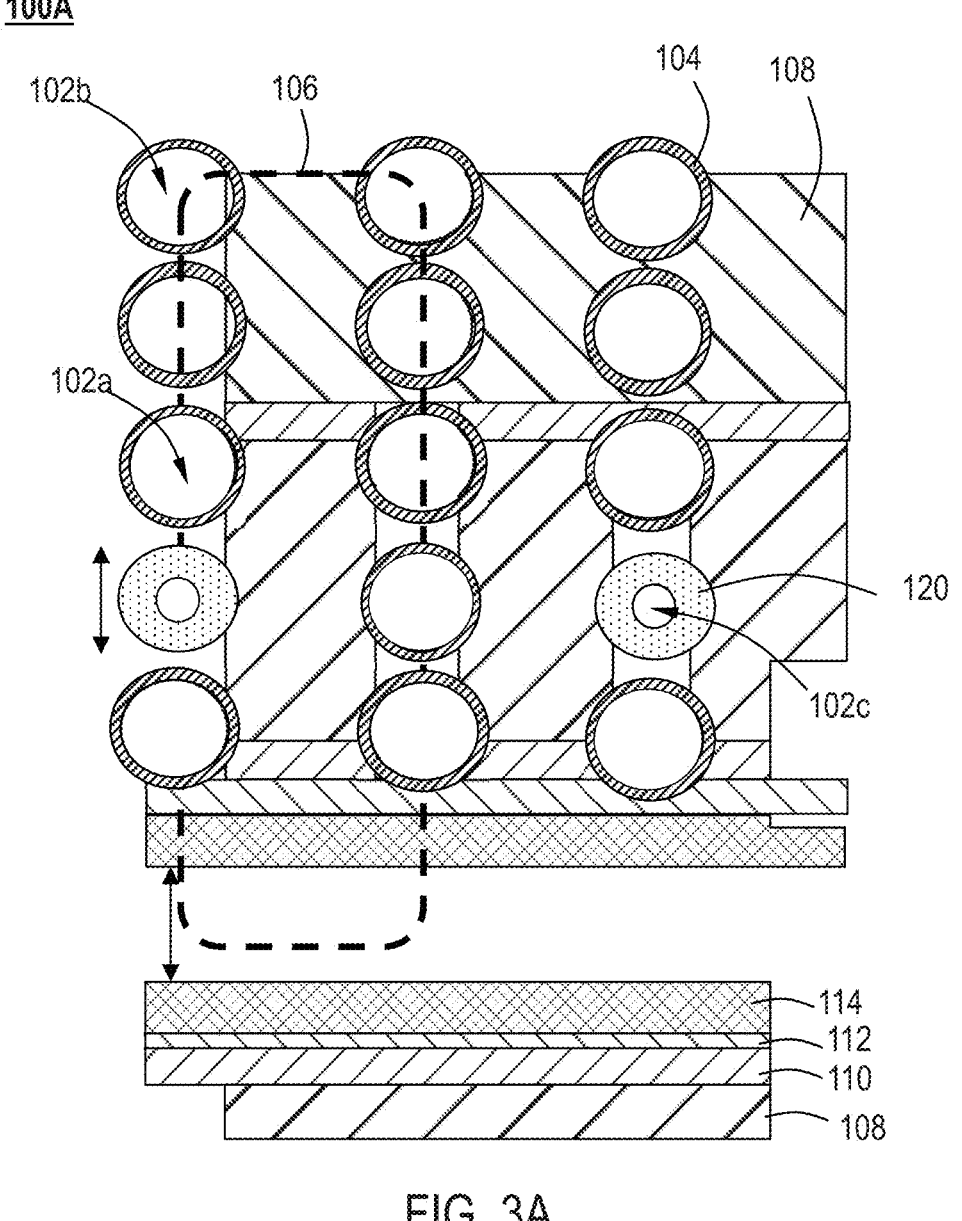
FIG. 3A illustrates a top view of a device according to one or more embodiments.
Figure 3B:
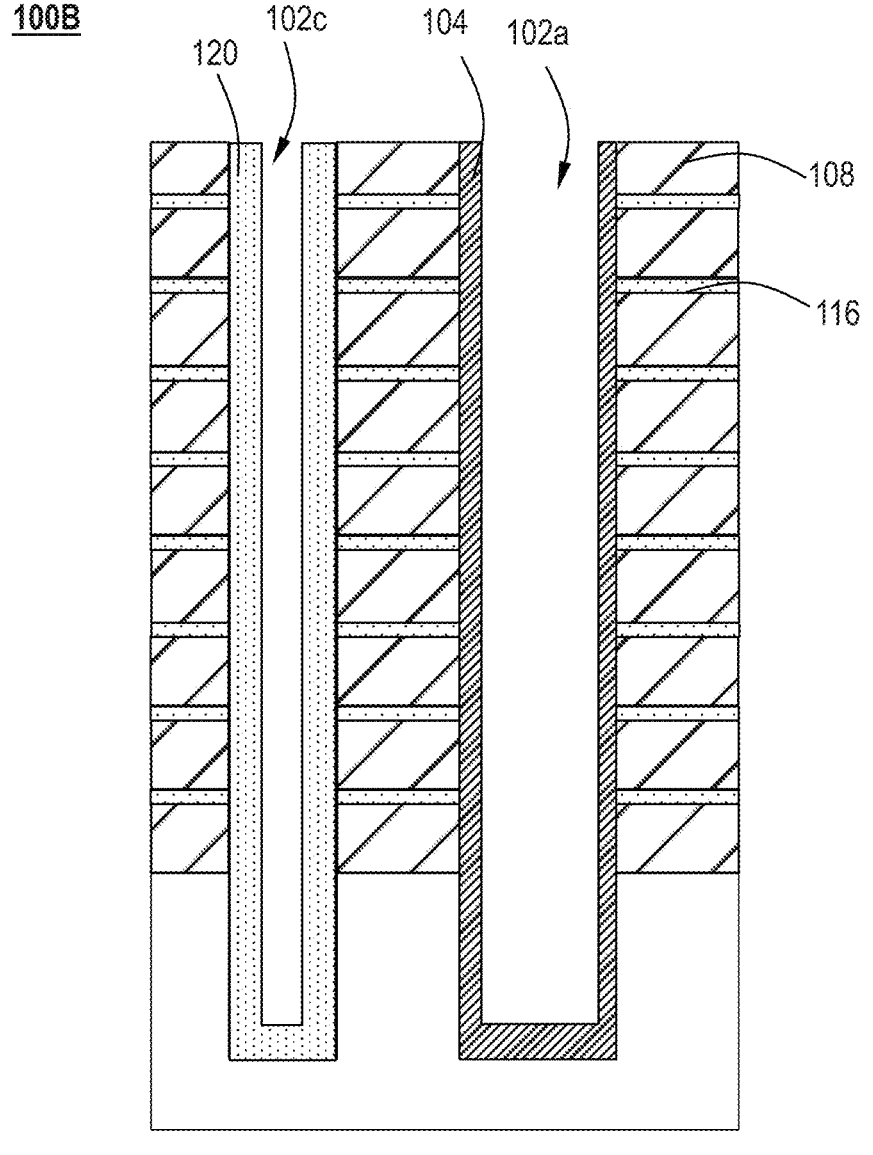
FIG. 3B illustrates an enlarged cross-section view of a portion of the device of FIG. 3A according to one or more embodiments.

Referring to FIG. 1 and FIGS. 3A and 3B, at operation 20, an epitaxial layer 120 is formed in the P-substrate openings 102c. The epitaxial layer 120 may be formed by any suitable process known to the skilled artisan.

In one or more embodiments, the epitaxial layer 120 is formed by selectively growing an epitaxial layer in the P-substrate opening 102c. Without intending to be bound by theory, it is thought that because the sidewall and bottom of the P-substrate opening 102c includes all single crystal silicon and single crystal silicon germanium, good crystal quality can be achieved by the epitaxial growth. In some embodiments, the epitaxial layer 120 is a poly-silicon layer and is formed by growing the poly-silicon layer in the P-substrate opening. In one or more embodiments, the polysilicon may be deposited everywhere (on the silicon in the P substrate holes and on the oxide layer in the word line opening and the deep trench isolation opening) and then the polysilicon is removed from the word line opening and the deep trench isolation opening when ready to be processed.

In some embodiments, the epitaxial layer 120 has a thickness in a range of from 10 nm to 25 nm. In one or more embodiments, the epitaxial layer 120 does not completely fill the P-substrate opening 102c.

In some embodiments, to form the epitaxial layer 120, a poly-silicon layer is deposited in each of the deep trench isolation opening, the word line opening, and the P-substrate opening and then the poly-silicon layer is selectively removed from the deep trench isolation opening and the word line opening and not from the at least one P-substrate opening. In one or more embodiments, the poly-silicon layer may then be recrystallized to form the epitaxial layer 120 in the at least one P-substrate opening 102c.

Figure 4A:
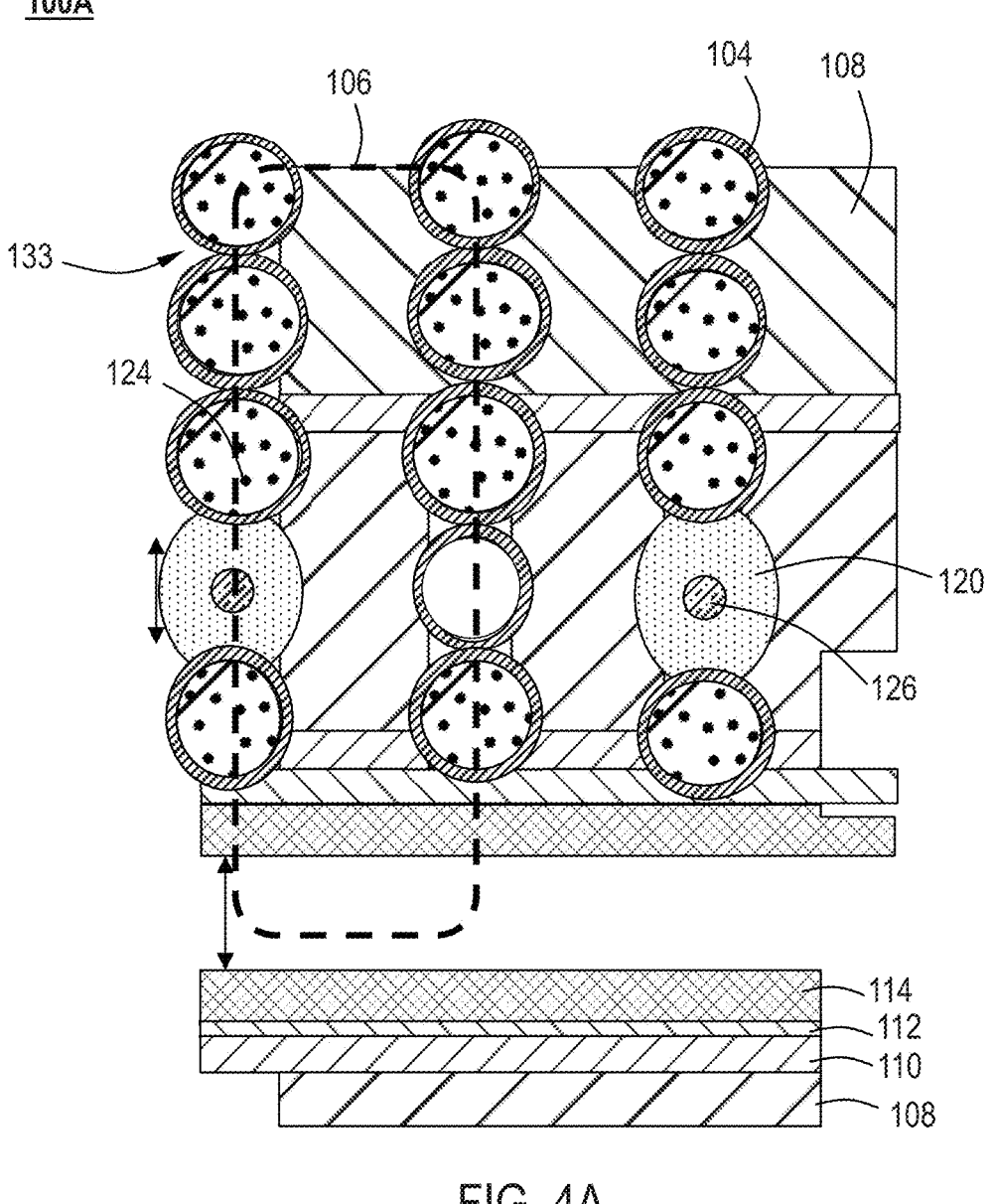
FIG. 4A illustrates a top view of a device according to one or more embodiments.
Figure 4B:
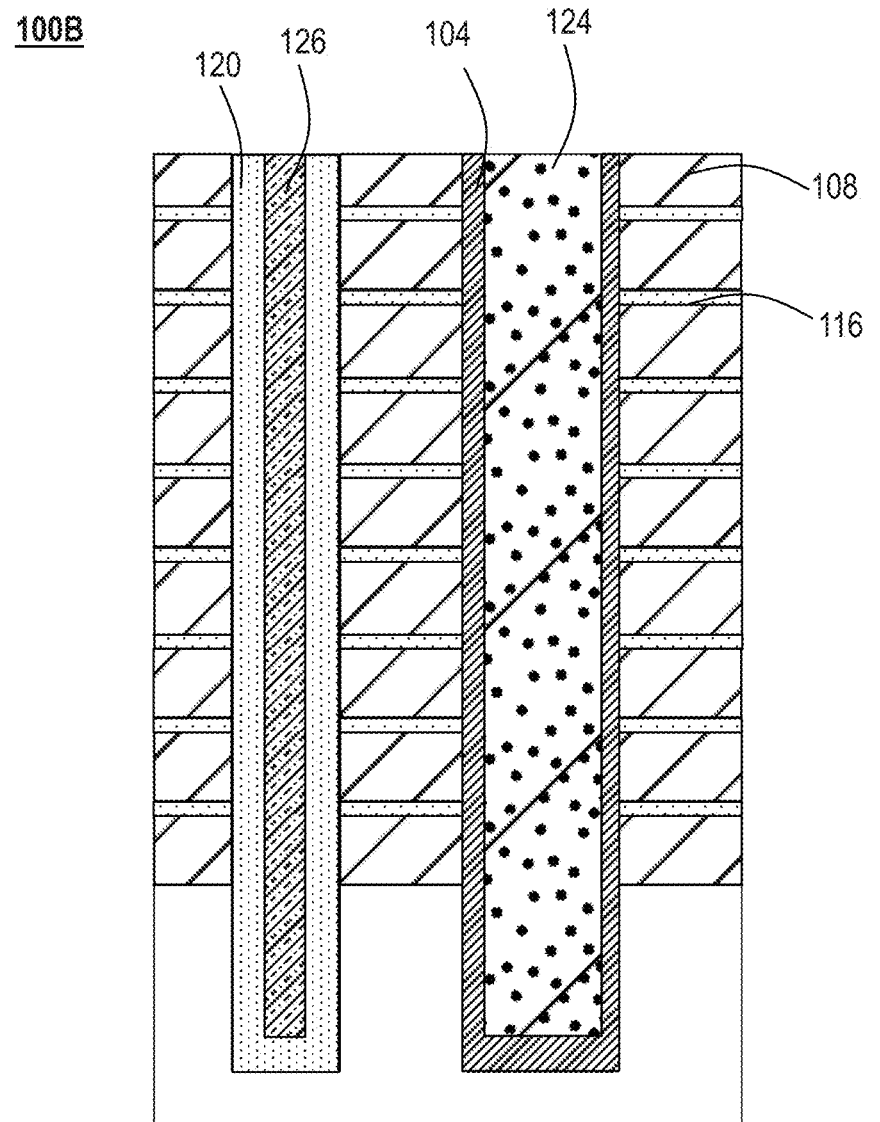
FIG. 4B illustrates an enlarged cross-section view of a portion of the device of FIG. 4A according to one or more embodiments.

Referring to FIG. 1 and FIGS. 4A, and 4B, at operation 22, a high-layer 126 may be deposited in the P-substrate opening 102c on a top surface of the epitaxial layer 120. The high-K layer 126 may comprise any suitable high-K material known to the skilled artisan. In one or more embodiments, the high-K layer includes one or more of aluminum oxide ($Al_2O_3$), hafnium oxide ($HfO_2$), zirconium oxide ($ZrO_2$), titanium oxide ($TiO_2$), and tantalum oxide ($Ta_2O_5$). In specific embodiments, the high-K layer comprises aluminum oxide ($Al_2O_3$).

With reference to FIG. 1, at operation 24, the deep trench isolation opening 102b is enlarged such that the diameter of the deep trench isolation opening 102b is in a range of from 50 nm to 80 nm. In one or more embodiments, enlarging the deep trench isolation opening 102b forms a semiconductor isolation bridge 133 between adjacent deep trench isolation openings 102b. The physical silicon connection between all these channels is electrically isolated even when the word line gate is biased to make each individual channel conductive.

In one or more embodiments, at operation 26, an oxide layer 104 is deposited in the enlarged deep trench isolation opening 102b. The oxide layer 104 may comprise any suitable oxide material known to the skilled artisan. In some embodiments, the oxide layer 104 includes one or more of silicon oxide ($SiO_2$), aluminum oxide ($Al_2O_3$), carbon, and nitride. Accordingly, in some embodiments, the oxide layer is an oxycarbide layer. In other embodiments, the oxide layer may be an oxycarbonitride layer.

At operation 28, a nitride layer 124 is deposited in the deep trench isolation opening 102b on the oxide layer 104. The nitride layer may comprise any suitable nitride material known to the skilled artisan. In one or more embodiments, the nitride layer 124 comprises silicon nitride (SiN).

Referring to FIG. 1 and FIGS. 5A thru 5C, at operation 30, the oxide liner 104 is removed from the word line opening 102a, and an opening 130 for the word line gate is formed.

Figure 5A:
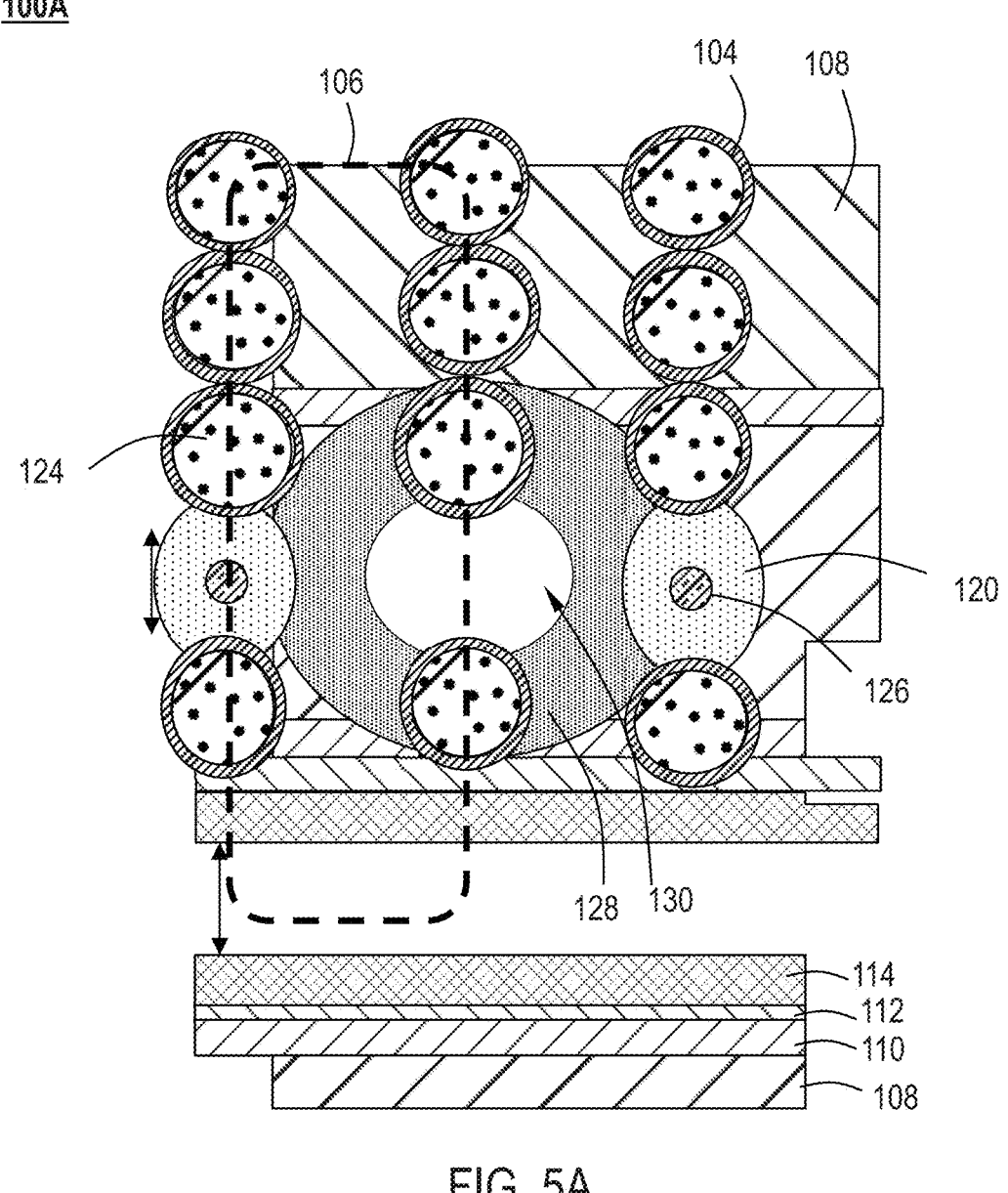
FIG. 5A illustrates a top view of a device according to one or more embodiments.
Figure 5B:
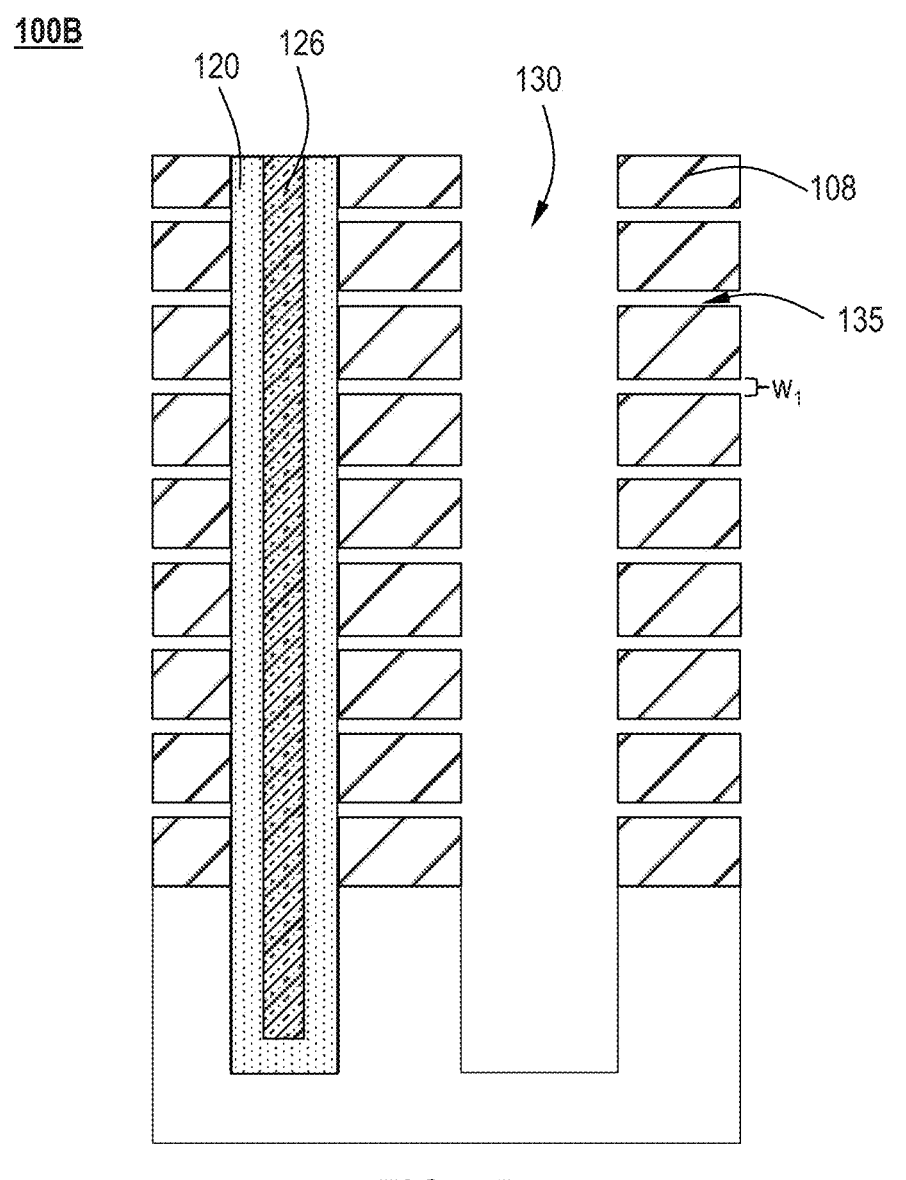
FIG. 5B illustrates an enlarged cross-section view of a portion of the device of FIG. 5A according to one or more embodiments.
Figure 5C:
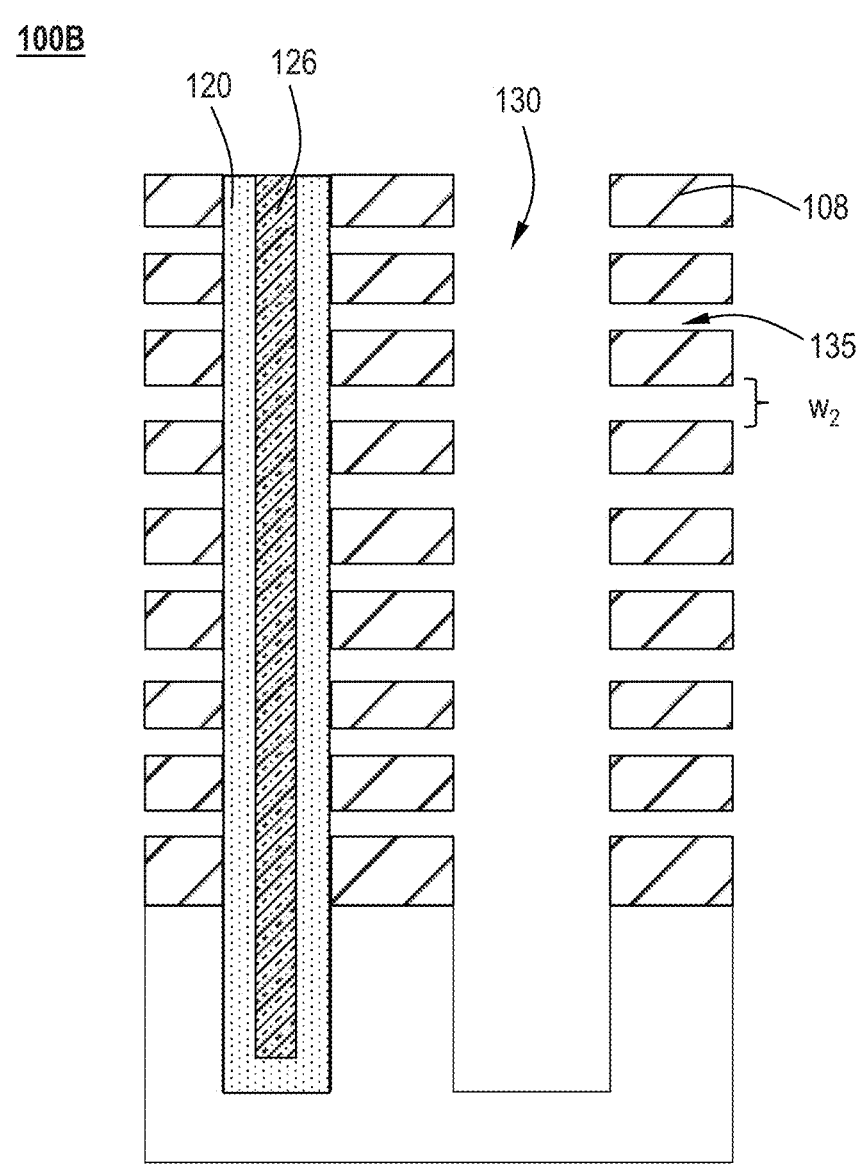
FIG. 5C illustrates an enlarged cross-section view of a portion of the device of FIG. 5A according to one or more embodiments.

At operation 32, the word line gate is then formed. In one or more embodiments, forming the word line gate includes recessing the second material layer 116 to expose the epitaxial layer 120 and form a recessed region 135 having a first width, $w_1$. With reference to FIG. 5C, in one or more embodiments, the first material layer 108 is then etched to increase the width of the recessed region 135 to a second width, $w_2$, greater than the first width, $w_1$.

Figure 6A:
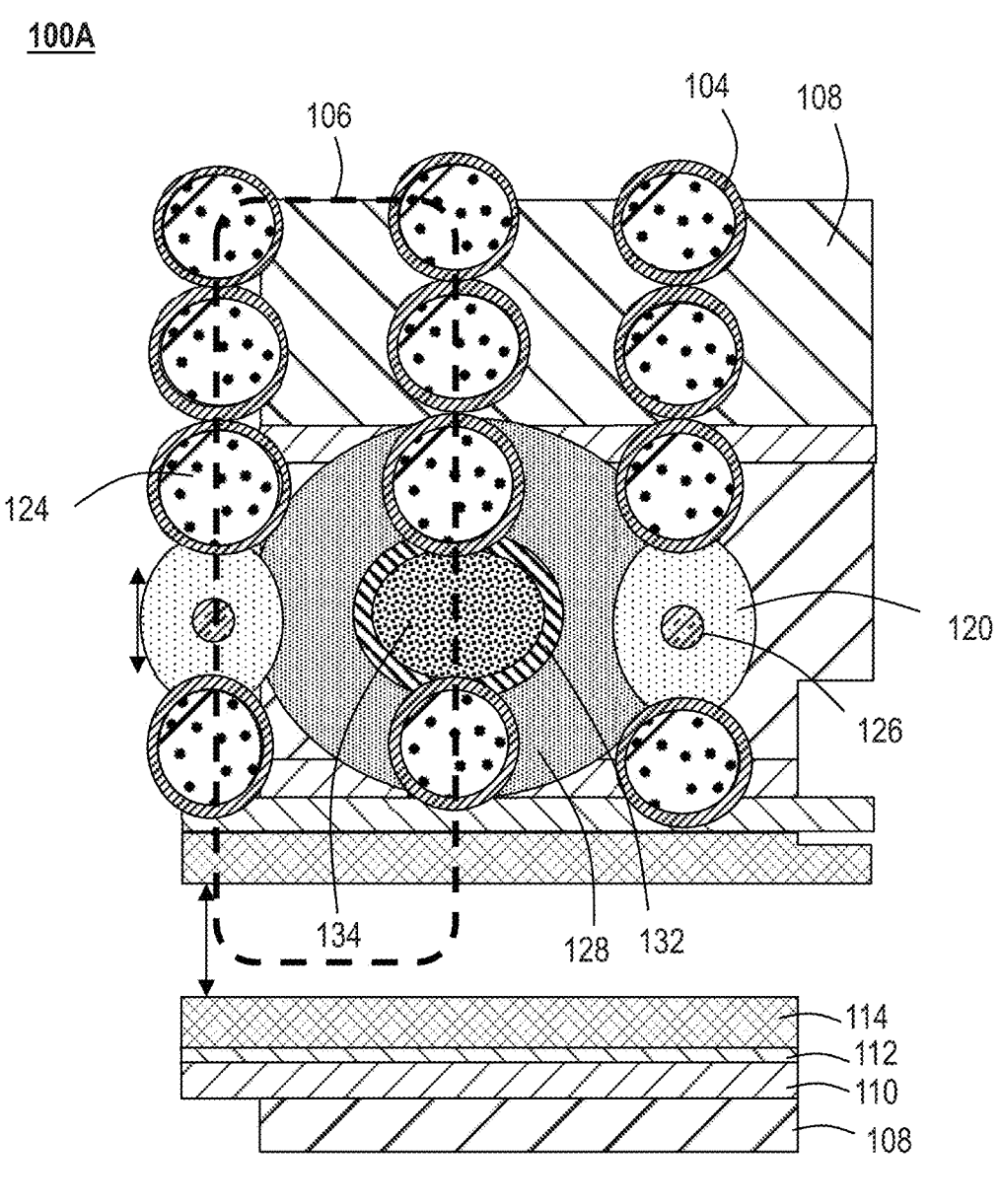
FIG. 6A illustrates a top view of a device according to one or more embodiments.
Figure 6B:
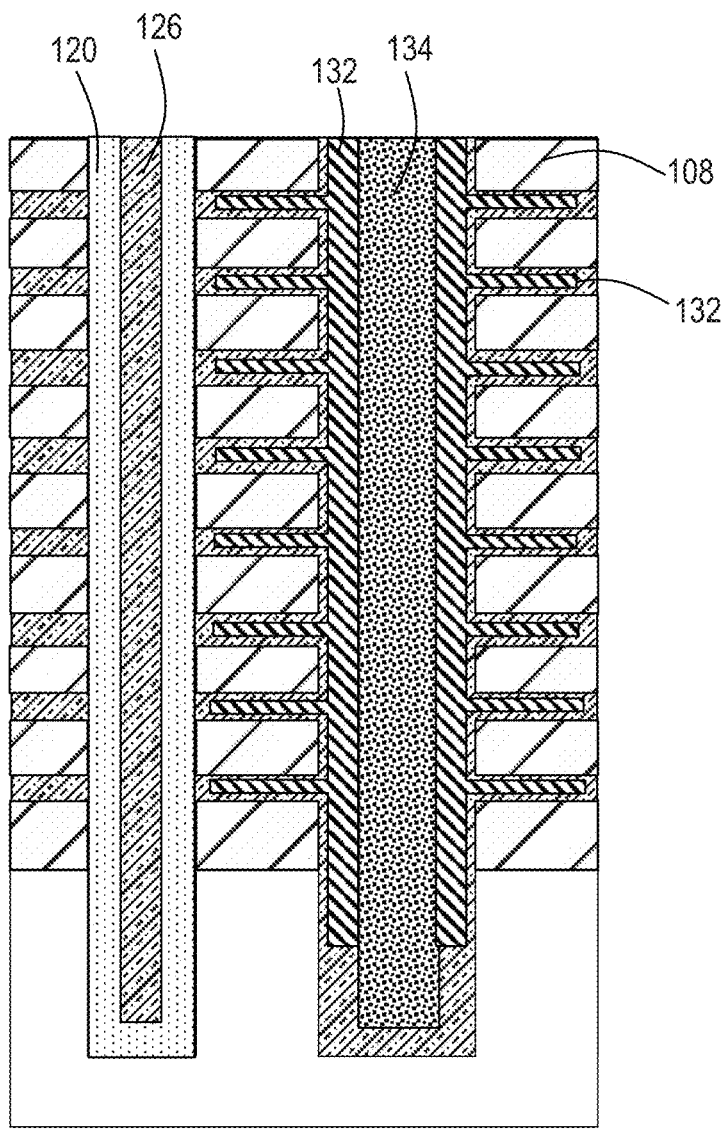
FIG. 6B illustrates an enlarged cross-section view of a portion of the device of FIG. 6A according to one or more embodiments.

With reference to FIGS. 6A and 6B, a gate oxide layer 132 is deposited to partially fill the recessed region 135. In one or more embodiments, a gate electrode layer 134 is deposited on the gate oxide layer 132 to fill the recessed region 135.

The gate oxide layer 132 may comprise any suitable material known to the skilled artisan. In some embodiments, the gate oxide layer 132 comprises one or more thermally grown or deposited material. In one or more embodiments, the gate oxide layer 132 comprises one or more of silicon oxide ($SiO_2$), aluminum oxide ($Al_2O_3$), hafnium oxide ($HfO_2$), and zirconium oxide ($ZrO_2$).

The gate electrode layer 134 may comprise any suitable material known to the skilled artisan. In one or more embodiments, the gate electrode layer 134 may comprise one or more of a metal, a metal nitride, doped polysilicon, and undoped polysilicon. In specific embodiments, the gate electrode layer 134 comprises one or more of tungsten (W), cobalt (Co), molybdenum (Mo), ruthenium (Ru), titanium nitride (TiN), tantalum nitride (TaN), and N doped polysilicon.

Figure 7:
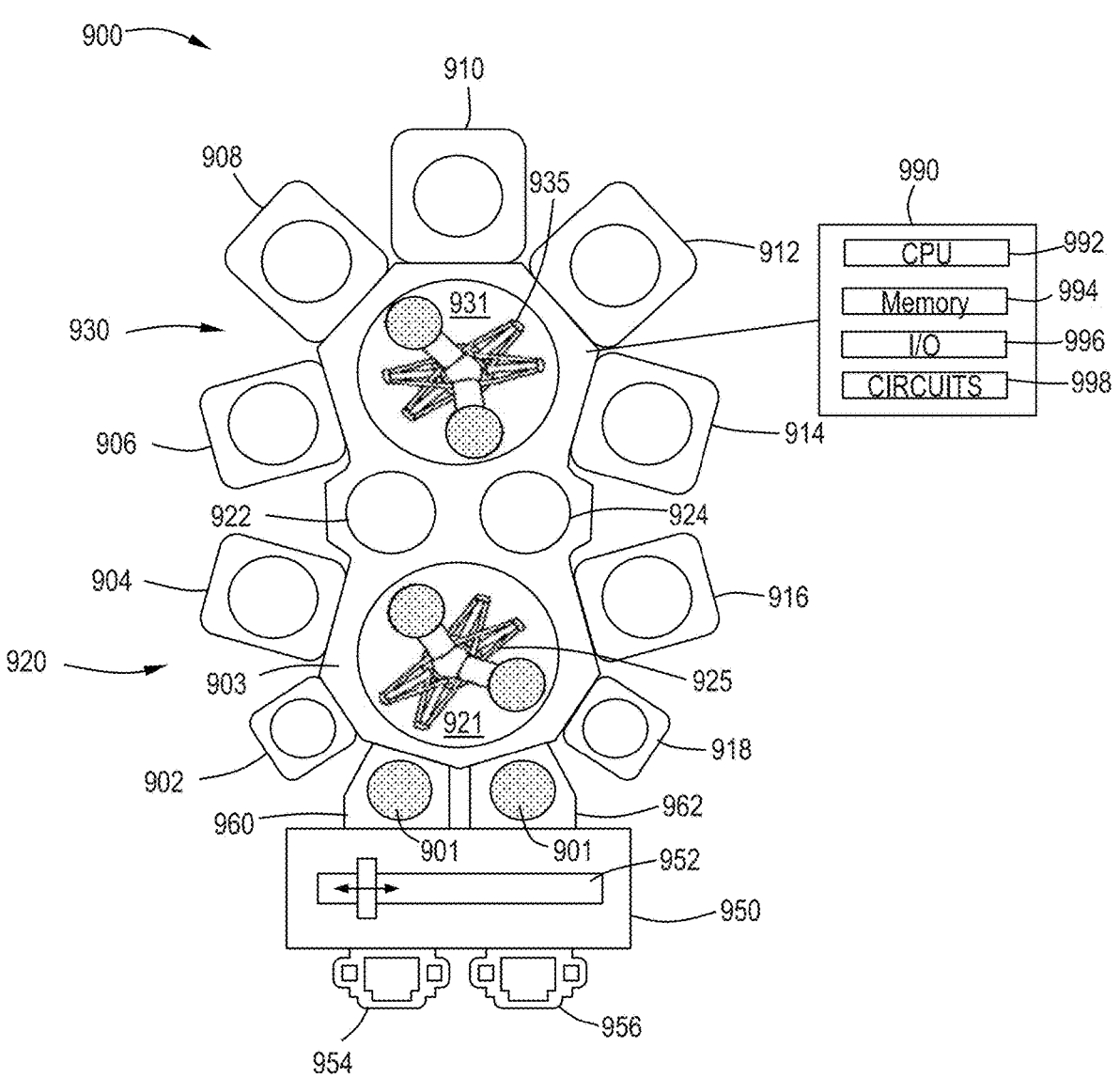
FIG. 7 illustrates a cluster tool according to one or more embodiments.

Additional embodiments of the disclosure are directed to processing tools 900 for the formation of the memory devices and methods described, as shown in FIG. 7. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a selective etching chamber, an epitaxial growth chamber, and the like. The particular arrangement of process chambers and components can be varied depending on the cluster tool and should not be taken as limiting the scope of the disclosure.

In the embodiment shown in FIG. 7, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU), memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor memory device, the method comprising:

etching a plurality of openings in a memory stack on a substrate to form at least one deep trench isolation opening, at least one word line opening, and at least one P-substrate opening, the memory stack comprising alternating layers of a first material layer and a second material layer and the plurality of openings extending from a top surface of the memory stack into the substrate;

depositing a first oxide layer in each of the at least one deep trench isolation opening, the at least one word line opening, and the at least one P-substrate opening;

selectively removing the first oxide layer from the at least one P-substrate opening;

forming an epitaxial layer in the at least one P-substrate opening, the epitaxial layer doped with boron;

enlarging the at least one deep trench isolation opening;

depositing a second oxide layer in the at least one deep trench isolation opening;

depositing a nitride layer in the at least one deep trench isolation opening and on the second oxide layer;

removing the first oxide layer from the at least one word line opening; and forming a word line gate in the at least one word line opening.

2. The method of claim 1, wherein forming the epitaxial layer comprises selectively growing the epitaxial layer in the P-substrate opening.

3. The method of claim 1, wherein forming the epitaxial layer comprises selectively growing a poly-silicon layer in the P-substrate opening.

4. The method of claim 1, further comprising depositing a high-K layer in the P-substrate opening on a top surface of the epitaxial layer.

5. The method of claim 4, wherein the high-K layer comprises one of more of aluminum oxide ($Al_2O_3$), hafnium oxide ($HfO_2$), zirconium oxide ($ZrO_2$), titanium oxide ($TiO_2$), and tantalum oxide ($Ta_2O_5$).

6. The method of claim 1, wherein forming the word line gate comprises:

recessing the second material layer to expose the epitaxial layer and form a recessed region having a first width;

etching the first material layer to increase the first width of the recessed region to a second width greater than the first width;

depositing a gate oxide layer to partially fill the recessed region; and depositing a gate electrode layer on the gate oxide layer to fill the recessed region.

7. The method of claim 6, wherein the gate electrode layer comprises one or more of a metal, a metal nitride, doped polysilicon, and undoped polysilicon.

8. The method of claim 7, wherein the gate electrode layer comprises one or more of tungsten (W), cobalt (Co), molybdenum (Mo), ruthenium (Ru), titanium nitride (TiN), tantalum nitride (TaN), and N doped polysilicon.

9. The method of claim 1, wherein the first material layer and the second material layer independently comprise one or more of silicon (Si) and silicon germanium (SiGe).

10. The method of claim 1, wherein the first oxide layer and the second oxide layer independently comprise one or more of silicon oxide ($SiO_2$), aluminum oxide ($Al_2O_3$), carbon, and nitride.

11. The method of claim 1, wherein enlarging the at least one deep trench isolation opening forms a bridge between adjacent deep trench isolation openings.

12. A method of forming a semiconductor memory device, the method comprising:

depositing a first oxide layer in each of at least one deep trench isolation opening, at least one word line opening, and at least one P-substrate opening in a memory stack, the memory stack comprising alternating layers of a first material layer and a second material layer;

selectively removing the first oxide layer from the at least one P-substrate opening;

forming an epitaxial layer in the P-substrate opening, the epitaxial layer doped with boron;

forming a bridge between adjacent deep trench isolation openings;

depositing a second oxide layer in the at least one deep trench isolation opening;

depositing a nitride layer in the at least one deep trench isolation opening and on the second oxide layer;

depositing a high-K layer in the P-substrate opening on a top surface of the epitaxial layer;

removing the first oxide layer from the at least one word line opening; and forming a word line gate in the at least one word line opening.

13. The method of claim 12, wherein the high-K layer comprises one of more of aluminum oxide ($Al_2O_3$), hafnium oxide ($HfO_2$), zirconium oxide ($ZrO_2$), titanium oxide ($TiO_2$), and tantalum oxide ($Ta_2O_5$).

14. The method of claim 12, wherein forming the word line gate comprises:

recessing the second material layer to expose the epitaxial layer and form a recessed region having a first width;

etching the first material layer to increase the first width of the recessed region to a second width greater than the first width;

removing the second material layer to expose the at least one deep trench isolation opening and form a gap;

depositing a gate oxide layer to partially fill the gap; and depositing a gate electrode layer on the gate oxide layer to fill the gap.

15. The method of claim 14, wherein the gate electrode layer comprises one or more of a metal, a metal nitride, doped polysilicon, and undoped polysilicon.

16. The method of claim 15, wherein the gate electrode layer comprises one or more of tungsten (W), cobalt (Co), molybdenum (Mo), ruthenium (Ru), titanium nitride (TIN), tantalum nitride (TaN), and N doped polysilicon.

17. The method of claim 12, wherein the first material layer and the second material layer independently comprise one or more of silicon (Si) and silicon germanium (SiGe).

18. The method of claim 12, wherein the first oxide layer and the second oxide layer independently comprise one or more of silicon oxide ($SiO_2$), aluminum oxide ($Al_2O_3$), carbon, and nitride.

19. The method of claim 12, wherein forming the epitaxial layer comprises one or more of selectively growing the epitaxial layer in the P-substrate opening, or depositing a poly-silicon layer in each of the at least one deep trench isolation opening, the at least one word line opening, and the at least one P-substrate opening and selectively removing the poly-silicon layer from the at least one deep trench isolation opening and the at least one word line opening and not from the at least one P-substrate opening, and then recrystallizing the poly-silicon layer to form the epitaxial layer in the at least one P-substrate opening.

20. The method of claim 12, wherein forming the epitaxial layer comprises selectively growing the epitaxial layer in the P-substrate opening.

5

\* \* \* \* \*